United States Patent
Cha et al.

(10) Patent No.: US 7,482,389 B2
(45) Date of Patent: Jan. 27, 2009

(54) NANOPOROUS MEDIA WITH LAMELLAR STRUCTURES

(75) Inventors: Jennifer Nam Cha, Union City, CA (US); Geraud Jean-Michel Dubois, Los Gatos, CA (US); James Lupton Hedrick, Pleasanton, CA (US); Ho-Cheol Kim, San Jose, CA (US); Victor Yee-Way Lee, San Jose, CA (US); Teddie Peregrino Magbitang, San Jose, CA (US); Robert Dennis Miller, San Jose, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 439 days.

(21) Appl. No.: 11/111,055

(22) Filed: Apr. 20, 2005

(65) Prior Publication Data

US 2006/0240240 A1    Oct. 26, 2006

(51) Int. Cl.
    *B32B 3/26* (2006.01)
(52) U.S. Cl. .............................. 521/61; 521/62; 521/77; 521/114; 521/134; 521/154; 428/447; 428/448; 428/304.4
(58) Field of Classification Search ................... 521/61, 521/62, 77, 114, 134, 154; 428/447, 448, 428/304.4
    See application file for complete search history.

(56) References Cited

U.S. PATENT DOCUMENTS

| | | |
|---|---|---|
| 4,507,466 A | 3/1985 | Tomalia et al. |
| 4,558,120 A | 12/1985 | Tomalia et al. |
| 4,568,737 A | 2/1986 | Tomalia et al. |
| 4,587,329 A | 5/1986 | Tomalia et al. |
| 4,631,337 A | 12/1986 | Tomalia et al. |
| 4,694,064 A | 9/1987 | Tomalia et al. |
| 4,713,975 A | 12/1987 | Tomalia et al. |
| 4,737,550 A | 4/1988 | Tomalia |
| 4,857,599 A | 8/1989 | Tomalia et al. |
| 4,871,779 A | 10/1989 | Killat et al. |
| 5,418,301 A | 5/1995 | Hult et al. |
| 5,895,263 A | 4/1999 | Carter et al. |
| 6,093,636 A | 7/2000 | Carter et al. |
| 6,097,095 A | 8/2000 | Chung |
| 6,107,357 A | 8/2000 | Hawker et al. |
| 6,277,766 B1 | 8/2001 | Ayers |
| 6,372,666 B1 | 4/2002 | Ramos et al. |
| 6,399,666 B1 | 6/2002 | Hawker et al. |
| 6,426,372 B1 | 7/2002 | Minami et al. |
| 6,541,107 B1 | 4/2003 | Zhong et al. |
| 6,602,804 B2 | 8/2003 | Allen et al. |
| 6,630,520 B1 | 10/2003 | Bruza et al. |
| 6,653,358 B2 | 11/2003 | Bruza et al. |
| 6,670,285 B2 | 12/2003 | Hawker et al. |
| 6,685,983 B2 | 2/2004 | Hawker et al. |
| 6,747,123 B2 | 6/2004 | Chen et al. |
| 2002/0055891 A1 | 5/2002 | Yang |
| 2002/0123240 A1 | 9/2002 | Gallagher et al. |
| 2002/0132496 A1 | 9/2002 | Ball et al. |
| 2002/0164891 A1 | 11/2002 | Gates et al. |
| 2003/0165625 A1 | 9/2003 | So et al. |
| 2003/0175534 A1 | 9/2003 | Chen et al. |
| 2003/0207595 A1 | 11/2003 | Ralamasu et al. |
| 2003/0216058 A1 | 11/2003 | Ko et al. |
| 2004/0023453 A1 | 2/2004 | Xu et al. |
| 2004/0091624 A1 | 5/2004 | Chen et al. |
| 2004/0137241 A1 | 7/2004 | Lin et al. |
| 2004/0157248 A1 | 8/2004 | Cox et al. |
| 2006/0205875 A1* | 9/2006 | Cha et al. ...................... 525/88 |

OTHER PUBLICATIONS

Baney et al., (1995), "Silsesquioxanes," *Chemical Reviews*, 95(5):1409-1430.
Bates, (1991), "Polymer-polymer phase behavior," *Science*, 251:898-905.
Chang et al., (2004), "Poly(methyl silsesquioxane)/amphiphilic block copolymer hybrids and their porous derivatives: Poly(styrene-*block*-acrylic acid) and poly(styrene-*block*-3-trimethoxysilylpropyl methacrylate)," *Journal of Polymer Science. Part B: Polymer Physics*, 42(24):4466-4477.
Hawker et al., (Apr. 2000), "Supramolecular Approaches to Nanoscale Dielectric Foams for Advanced Microelectronic Devices," *MRS Bulletin*, 54-58.
Hedrick et al., (1998), "Templating Nanoporosity in Thin-Film Dielectric Insulators," *Advanced Materials*, 10(13):1049-1053.
Heise et al., (2000), "Starlike Polymeric Architectures by Atom Transfer Radical Polymerization: Templates for the Production of Low Dielectric Constant Thin Films," *Macromolecules*, 33:2346-2354.
Miller et al., (1999), "Porous Organosilicates for On-Chip Dielectric Applications," *MRS Symposium Proceedings*, 565:3-15.
Miller et al., (2004), "Nanoporous, Low-Dielectric Constant Organosilicate Materials Derived from Inorganic Polymer Blends," *ACS Symposium Series, Polymers for Microelectronics and Nanoelectronics*, Lin et al., eds., 11:144-160.

(Continued)

*Primary Examiner*—Irina S Zemel
(74) *Attorney, Agent, or Firm*—Isaac M. Rutenberg; Mintz, Levin, Cohn, Ferris, Glovsky and Popeo PC

(57) ABSTRACT

A nanoporous material exhibiting a lamellar structure is disclosed. The material comprises three or more substantially parallel sheets of an organosilicate material, separated by highly porous spacer regions. The distance between the centers of the sheets lies between 1 nm and 50 nm. The highly porous spacer regions may be substantially free of condensed material. For the manufacture of such materials, a process is disclosed in which matrix non-amphiphilic polymeric material and templating polymeric material are dispersed in a solvent, where the templating polymeric material includes a polymeric amphiphilic material. The solvent with the polymeric materials is distributed onto a substrate. Organization is induced in the templating polymeric material. The solvent is removed, leaving the polymeric materials in place. The matrix polymeric material is cured, forming a lamellar structure.

15 Claims, 9 Drawing Sheets

OTHER PUBLICATIONS

Nguyen et al., (1999), "Low-dielectric, Nanoporous Organosilicate Films via Inorganic/Organic Polymer Hybrid Templates," *Chem. Mater.*, 11:3080-3085.

Nguyen et al., (2000), "Hyperbranched Polyesters as Nanoporosity Templating Agents for Organosilicates," *Macromolecules*, 33:4281-4284.

Volksen et al., (2003), "Porous Organosilicates for On-Chip Applications: Dielectric Generational Extendibility by the Introduction of Porosity," *Low Dielectric Constant Materials for IC Applications*, Ho et al., eds., Springer-Verlag, 6:167-202.

Weener et al., (2001), "Some Unique Features of Dendrimers Based Upon Self-Assembly and Host-Guest Properties," *Dendrimers and Other Dendritic Polymers*, Frechet and Tomalia, eds., Wiley, 16:387-424.

Yang et al., (2002), "Nanoporous Ultralow Dielectric Constant Organosilicates Templated by Triblock Copolymers", *Chem. Mater.*, 14:369-374.

Yang et al., (2003), "Characterization of Nanoporous Ultra Low-$k$ Thin Films Templated by Copolymers with Different Architectures", *Radiation Physics & Chemistry*, 68:351-356.

Yang et al., (2001), "Molecular Templating of Nanoporous Ultralow Dielectric Constant ($\approx$ 1.5) Organosilicates by Tailoring the Microphase Separation of Triblock Copolymers," *Chem. Mater.*, 13:2762-2764.

Yang et al., (2001), "Processing and Characterization of Ultralow-Dielectric Constant Organosilicate," *J. Vac. Sci. Technol. B* 19(6):2155-2161.

Yang et al., (2001), "Design of Nanoporous Ultra Low-Dielectric Constant Organosilicates by Self-Assembly," *Polymeric Materials: Sci. & Eng.*, 84:790-791.

\* cited by examiner

NANOPOROUS MEDIA WITH LAMELLAR STRUCTURES

TECHNICAL FIELD

This invention relates generally to the fields of polymer chemistry and nanotechnology. More specifically, it relates to polymeric porogens which can serve as templates for the formation of porous materials.

BACKGROUND

There are a wide variety of applications for nanoporous materials. One application of interest is as dielectrics in the manufacture of integrated circuits. The introduction of porosity into a dielectric generally reduces its dielectric constant, since the dielectric constant of air is close to 1 while that of the common dielectric materials is higher. The reduction of dielectric constant is desirable for a variety of reasons in integrated circuit manufacturing. Another application of porosity is the formation of very small channels in the material which may be used for a variety of purposes, for example as sensors. More generally, nanoporous materials have been considered for use in such applications as photonic devices, catalysis, environmental pollution control, separation and isolation of biological molecules, membranes, and energy storage.

A large number of approaches have been attempted to create nanoporous materials. One approach which is generally promising is the use of sacrificial porogens. A sacrificial porogen is a substance which mixes with a polymer matrix out of which the nanoporous material will be made. As the nanohybrid material forms from the matrix, for example through controlled thermal processing, the porogen is dispersed. Once the nanohybrid material is formed, the porogen molecules can then be eliminated, for example by heating, radiation, extraction, or use of a chemical reagent effective to degrade the porogen, leaving voids in their place.

A desirable characteristic for porogens is compatibility with the polymer matrix, allowing dispersal throughout this matrix and thus the creation of porosity spread uniformly throughout the resulting nanoporous material. While the porogens may aggregate somewhat among themselves within the matrix during the formation of the nanoporous material, they preferably do so in a controllable manner to form nanoscopic domains (2-50 nm).

A wide variety of porogens have been proposed and studied. See in this regard W. Volksen et al., "Porous Organosilicates for On-Chip Applications: Dielectric Generational Extendibity by the Introduction of Porosity," in *Low Dielectric Constant Materials for IC Applications*, P. S. Ho, J. Leu, W. W. Lee eds., chapter 6 (Springer-Verlag 2002).

Among the classes of porogens which have been studied, those which self-organize have received a fair amount of attention. In particular, as is well known, surfactants in solution may self-assemble into a variety of structures ranging from micelles to bilayers. Surfactants have been successfully employed to create nanoporosity in organosilicate matrices. See, e.g., Volksen et al., supra, at 171-72. Dendrimer self-organization in solution has also been studied. See in this regard J. W. Weener et al., "Some Unique Properties of Dendrimers Based upon Self-Assembly and Host-Guest Properties," in J. M. J. Fréchet & D. A. Tomalia eds., *Dendrimers and other Dendritic Polymers* (Wiley 2001).

SUMMARY OF THE INVENTION

In one aspect of the invention, a structure is provided which comprises three or more substantially parallel sheets of an organosilicate material, separated by highly porous spacer regions. The distance between the centers of the sheets lies between 1 nm and 50 nm. The highly porous spacer regions may be substantially free of condensed material.

In another aspect of the invention, a method is provided for forming mesoporous composite. In that method, matrix non-amphiphilic polymeric material and templating polymeric material are dispersed in a solvent, where the templating polymeric material includes a polymeric amphiphilic material. The solvent with the polymeric materials is distributed onto a substrate. Organization is induced in the matrix polymeric material. The solvent is removed, leaving the polymeric materials in place. The matrix polymeric material is cured, forming a lamellar structure which can be calcined to yield porous material.

DETAILED DESCRIPTION OF THE INVENTION

Figure 1:
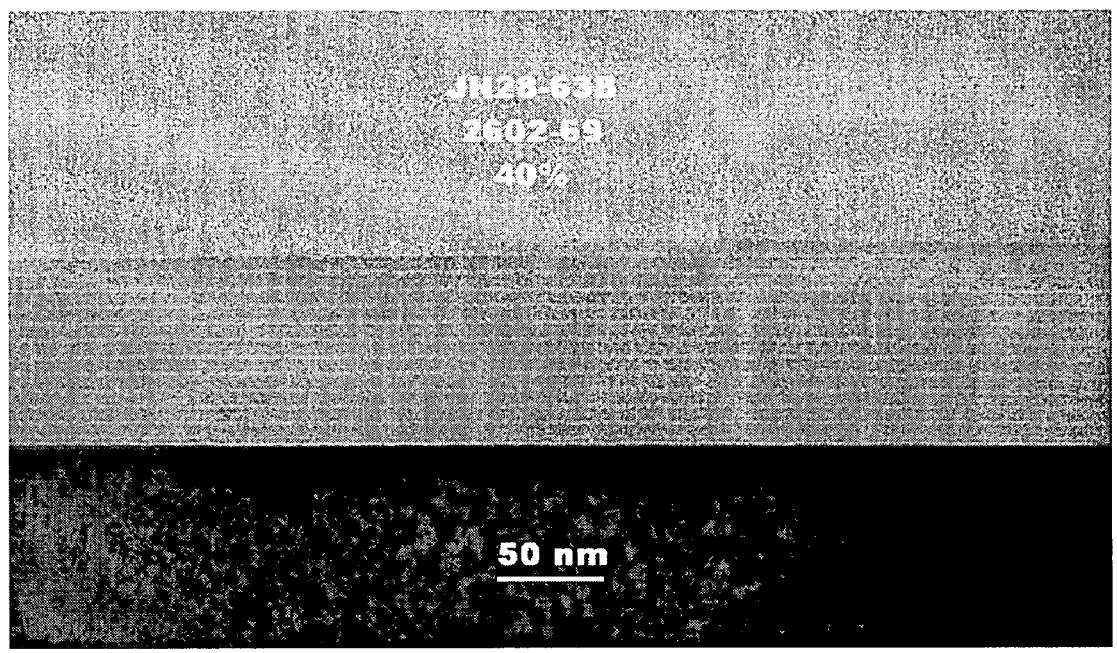
FIG. 1 shows two transmission electron micrographs of lamellar structures of the invention.
Figure 1:
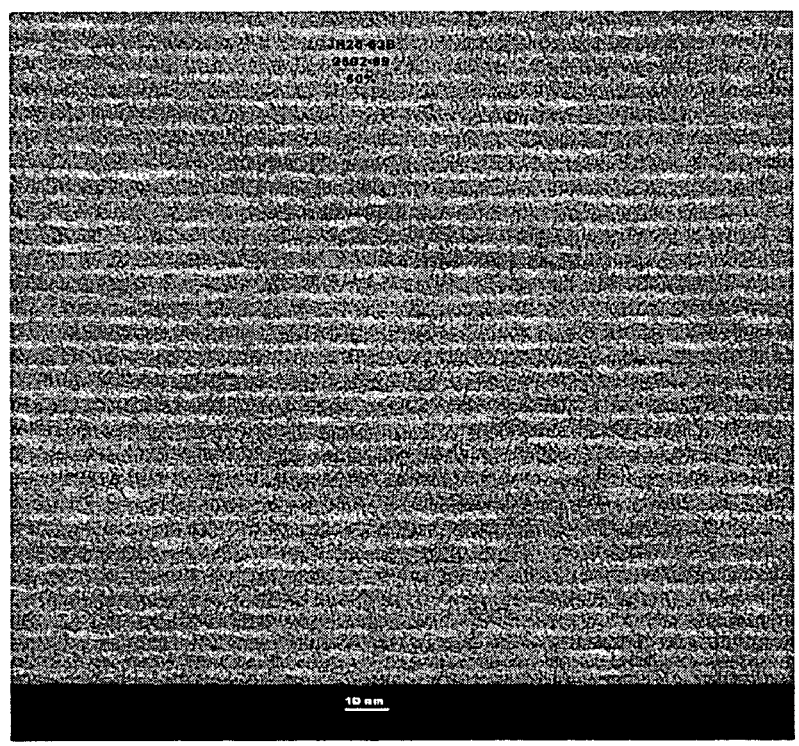

Unless otherwise indicated, this invention is not limited to specific compositions, components, or process steps. It should also be noted that the singular forms "a" and "the" are intended to encompass plural referents, unless the context clearly dictates otherwise. The terminology used herein is for the purpose of describing particular embodiments only and is not intended to be limiting.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "alkyl" as used herein refers to a branched or unbranched saturated hydrocarbon group typically although not necessarily containing 1 to about 24 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl, and the like. "Substituted alkyl" refers to alkyl substituted with one or more substituent groups, and the terms "heteroatom-containing alkyl" and "heteroalkyl" refer to alkyl in which at least one carbon atom is replaced with a heteroatom. If not otherwise indicated, the term "alkyl" includes linear, branched, cyclic, unsubstituted, substituted, and/or heteroatom-containing alkyl.

The term "alkenyl" as used herein refers to a linear, branched or cyclic hydrocarbon group of 2 to about 24 carbon atoms containing at least one double bond, such as ethenyl, n-propenyl, isopropenyl, n-butenyl, isobutenyl, octenyl, decenyl, tetradecenyl, hexadecenyl, eicosenyl, tetracosenyl, and the like. The term "substituted alkenyl" refers to alkenyl substituted with one or more substituent groups, and the terms "heteroatom-containing alkenyl" and "heteroalkenyl" refer to alkenyl in which at least one carbon atom is replaced with a heteroatom. If not otherwise indicated, the term "alkenyl" includes linear, branched, cyclic, unsubstituted, substituted, and/or heteroatom-containing alkenyl.

The term "alkynyl" as used herein refers to a linear or branched hydrocarbon group of 2 to 24 carbon atoms containing at least one triple bond, such as ethynyl, n-propynyl, and the like. The term "substituted alkynyl" refers to alkynyl substituted with one or more substituent groups, and the terms "heteroatom-containing alkynyl" and "heteroalkynyl" refer to alkynyl in which at least one carbon atom is replaced with a heteroatom. If not otherwise indicated, the term "alkynyl" includes linear, branched, unsubstituted, substituted, and/or heteroatom-containing alkynyl.

The term "alkoxy" as used herein intends an alkyl group bound through a single, terminal ether linkage; that is, an "alkoxy" group may be represented as —O-alkyl where alkyl is as defined above.

The term "aryl" as used herein, and unless otherwise specified, refers to an aromatic substituent containing a single aromatic ring or multiple aromatic rings that are fused together, directly linked, or indirectly linked (such that the different aromatic rings are bound to a common group such as a methylene or ethylene moiety). Exemplary aryl groups contain one aromatic ring or two fused or linked aromatic rings, e.g., phenyl, naphthyl, biphenyl, diphenylether, diphenylamine, benzophenone, and the like. "Substituted aryl" refers to an aryl moiety substituted with one or more substituent groups, and the terms "heteroatom-containing aryl" and "heteroaryl" refer to aryl substituent, in which at least one carbon atom is replaced with a heteroatom. If not otherwise indicated, the term "aryl" includes unsubstituted, substituted, and/or heteroatom-containing aromatic substituents.

The term "alkaryl" refers to an aryl group with an alkyl substituent, and the term "aralkyl" refers to an alkyl group with an aryl substituent, wherein "aryl" and "alkyl" are as defined above. Examples of aralkyl groups include, without limitation, benzyl, 2-phenyl-ethyl, 3-phenyl-propyl, 4-phenyl-butyl, 5-phenyl-pentyl, 4-phenylcyclohexyl, 4-benzylcyclohexyl, 4-phenylcyclohexylmethyl, 4-benzylcyclohexylmethyl, and the like. Alkaryl groups include, for example, p-methylphenyl, 2,4-dimethylphenyl, p-cyclohexylphenyl, 2,7-dimethylnaphthyl, 7-cyclooctylnaphthyl, 3-ethyl-cyclopenta-1,4-diene, and the like.

The term "polymer" is used to refer to a chemical compound that comprises linked monomers, and that may be linear, branched, or crosslinked. The term also encompasses not only homopolymers, but also copolymers, terpolymers, and the like. The term "copolymer," unless specifically indicated otherwise, refers to a polymer containing at least two different monomer units.

When a functional group is termed "protected," this means that the group is in modified form to preclude undesired side reactions at the protected site. Suitable protecting groups for the compounds of the present invention will be recognized from the present application taking into account the level of skill in the art, and with reference to standard textbooks, such as Greene et al., *Protective Groups in Organic Synthesis* (New York: Wiley, 1991).

The term "branched polymer" here is used to indicate a polymer which is not linear, that is, one in which the polymer molecule is not composed primarily of a single linear chain of monomers linked end to end. Branched polymers include, for example, dendrimers and hyperbranched polymers.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

In one aspect of the invention, a structure is provided which comprises three or more substantially parallel sheets of an organosilicate material, separated by highly porous spacer regions. The distance between the centers of the sheets lies between 1 nm and 50 nm. The highly porous spacer regions may be substantially free of condensed material, and may contain mostly air, ambient gases, or vacuum. Preferably, the structure is formed by templating suitable amphiphiles which arrange themselves during the process of curing into sheets which, upon removal of the amphiphiles, leave behind the spacer regions.

FIG. 1 depicts two structures of the invention, formed by processes which are described in detail below. In the TEM photograph, the existence of substantially parallel sheets is apparent.

There may be a number of substantially parallel sheets in the structures of the invention. For example, there may be four sheets, or ten sheets, or twenty sheets. There may be a roughly uniform distance between the substantially parallel sheets. The distance between sheets, depending on how the structure is made, may lie between 1 and 50 nm, preferably between 1 and 25 nm, more preferably between 1 and 15 nm. The spacer regions may account for 25% to 70% of the volume of the structure, preferably between 30% and 50% of the volume of the structure.

The organosilicate materials of which the substantially parallel sheets are made may be chosen from a wide variety of organosilicates which form useful solids. The organosilicates may be, for example, (i) silsesquioxanes; (ii) partially condensed alkoxysilanes; (iii) organically modified silicates having the composition $RSiO_3$ and $R_2SiO_2$; and (iv) partially condensed orthosilicates having the composition $Si(OR)_4$, wherein R is alkyl, alkenyl, alkynyl, alkoxy, aryl, aralkyl, alkaryl or halo. If the organoslicate is a silsesquioxane, it may be, for example, methyl silsesquioxane, polymethyl silsesquioxane, polymethylhydroxyl silsesquioxane, polyphenyl silsesquioxane, polyphenylmethyl silsesquioxane, polyphenylpropyl silsesquioxane, polyphenylvinyl silsesquioxane, polycyclohexyl silsesquioxane, polycyclopentyl silsesquioxane, polycyclohexyl silsesquioxane and poly(2-chloroethyl) silsesquioxane, or copolymers of these. Useful organosilicates are also listed in U.S. Pat. No. 6,399,666.

The dielectric constants of the structures of the invention will preferably be in the range of 1.1 to 3.0, more preferably 1.1 to 2.5. The indices of refraction of the structures of the invention will preferably be in the range of about 1.1 to 1.5, more preferably in the range of 1.15 to 1.25.

In another aspect of the invention, a method is provided for forming a mesoporous composite. In that method, matrix non-amphiphilic polymeric material and templating polymeric material are dispersed in a solvent, where the templating polymeric material includes a polymeric amphiphilic material. The solvent with the polymeric materials is distributed onto a substrate. Organization is induced in the matrix polymeric material, often during solvent evaporation. The solvent is removed, leaving the polymeric materials in place. The matrix polymeric material is cured below the porogen decomposition temperature, forming a lamellar structure.

The matrix non-amphiphilic polymeric materials for this method may be, for example, inorganic thermosets, silsesquioxanes, organic silicas, or organic thermosetting resins, such as SiLK (Dow Chemical Company), polyimides, polyarylene ethers, polybenzazoles, or polyquionolines. Among organosilicates, those recited previously are generally useful, particularly the silsequioxanes.

The templating polymeric materials for use in the methods of the invention are preferably amphiphilic. The templating polymeric material is preferably spatially unsymmetric, and can preferably consist of a branched or linear component which is compatible with the non-cross-linked matrix polymeric material and which is attached to a non-miscible component which is branched. Depending on the polarity of the matrix, the core and shell can be hydrophobic-hydrophilic or the reverse.

The templating polymeric materials for use in the methods of the invention preferably are intermediate in character between those of formed from conventional surfactants and unconstrained block copolymers. In general terms, the most preferred polymeric materials are those which can be given the shape of surfactants and the size of block copolymers. This flexibility allows one to template a wide variety of porous morphologies through an amphiphile-organosilicate self-organization process, including lamellar morphologies.

In the preparation of the templating polymeric materials for use in the methods of the invention, a wide variety of techniques for the preparation of branched components can be employed. A number of techniques for the preparation and characterization of dendrimers, dendrons, dendrigrafts, and hyperbranched polymers are known. Examples of dendrimers and dendrons, and methods of synthesizing the same are set forth in U.S. Pat. Nos. 4,507,466; 4,558,120; 4,568,737; 4,587,329; 4,631,337; 4,694,064; 4,713,975; 4,737,550; 4,871,779 and 4,857,599. Examples of hyperbranched polymers and methods of preparing the same are set forth, for example, in U.S. Pat. No. 5,418,301. Some dendritic polymers are also commercially available. For example, 3- and 5-generation hyperbranched polyester polyols may be obtained from Perstorp Polyols, Inc., Toledo, Ohio.

A possible synthetic technique for hyperbranched polymers is the one-pot polymerization reaction of a single type of monomer having a single reactive group of a first type (B) and a plurality (y) of reactive groups of a second type (A), i.e., a B-Ay type monomer. The one-pot synthesis method for hyperbranched polymers is simpler and less expensive than the divergent and convergent synthesis methods for dendrimers. However, the one-pot synthesis method lacks reaction control, which leads to more polydisperse products with larger deviations from ideal dendron structures.

Dendrimers can be prepared by convergent or divergent synthesis. Divergent synthesis of dendrimers involves a molecular growth process which occurs through a consecutive series of geometrically progressive step-wise additions of branches upon branches in a radially outward molecular direction to produce an ordered arrangement of layered branch generations, in which each macromolecule includes a core generation, one or more layers of internal generations, and an outer layer of surface generations. Each of the generations includes a single branch juncture. The generations can be the same or different in chemical structure and branching functionality. The surface branch generations may contain either chemically reactive or passive functional groups. Chemically reactive surface groups can be used for further extension of dendritic growth, for amplification of functional groups, or for modification of dendritic molecular surfaces. The chemically passive groups may be used to physically modify dendritic surfaces, such as to adjust the ratio of hydrophobic to hydrophilic terminals and/or the hydrophilic/hydrophobic nature of the polymer. Convergent synthesis of dendrimers involves a growth process which begins from what will become the surface of the dendrimers and progresses radially in a molecular direction toward a focal point or core.

As stated previously, the templating polymers of the invention are preferably amphiphilic and preferably have a branched or linear component which is compatible with the non-crosslinked matrix polymeric material. For certain common matrix polymeric materials, this compatibility will often imply that the branched or linear component is hydrophilic. This component may belong to a wide variety of linear and branched polymer families. It is preferred that this component, if branched, have fewer than four branches. Among linear polymers, polyethylene glycols (PEGs) and polypropylene glycols, and other polyalkylene oxides are particularly preferred. PEGs have been shown to be miscible with organosilicate prepolymers over a wide compositional and molecular weight range. The degree of polymerization of these linear polymers is variable but may preferably be between 50 and 500, more preferably between 100 and 250.

The templating polymers of the invention may take the general form of an AB block copolymer. The A component may comprise a linear or branched polymer. The B component is preferably branched, including hyperbranched. The B component may comprise a dendrimer. The A component may comprise poly alkylene oxides that are miscible with organosilicates.

Figure 2:
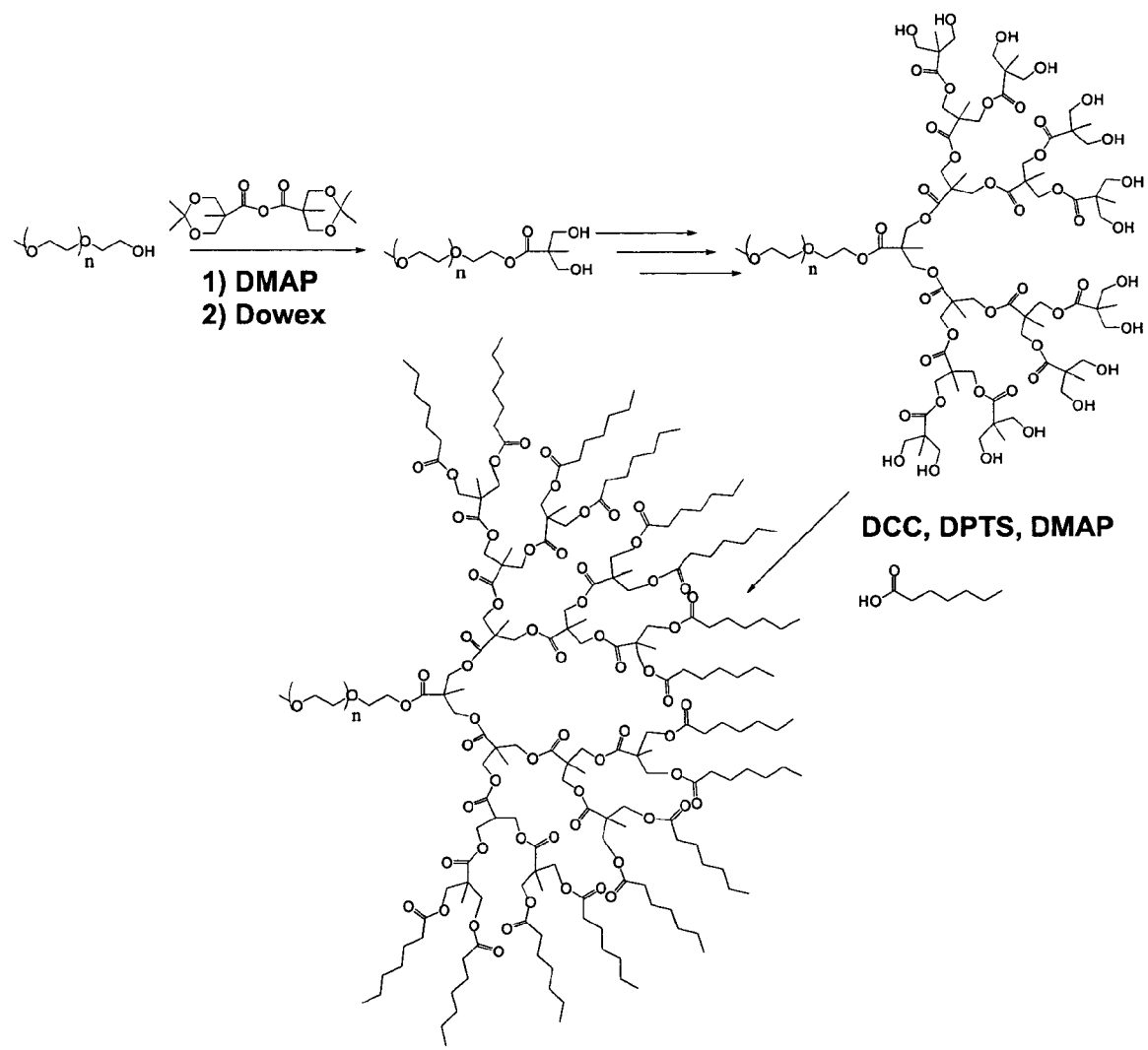
FIG. 2 schematically depicts chemical reactions suitable for synthesizing a preferred porogen.

A particularly preferred approach to the synthesis of amphiphiles capable of forming lamellar media is shown in FIG. 2. The starting materials are PEG alcohols and 2,2'-bis hydroxy methyl propanoic acid,

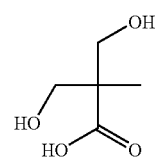

referred to as bis-MPA. The bis-MPA is acetonide-protected and then self-condensed into an anhydride,

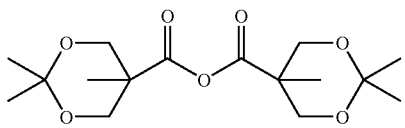

The anhydride is then reacted with the PEG alcohol, and the hydroxyl groups in the resulting ester are deprotected, producing:

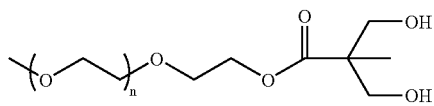

This can again be reacted with the protected anhydride, and the resulting moiety deprotected, producing:

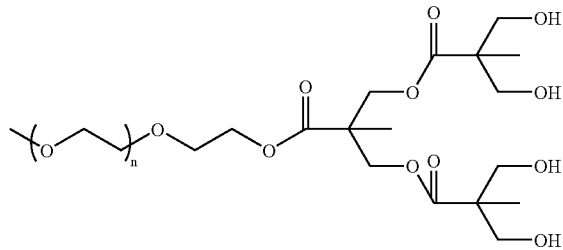

Repetition of these steps leads to spatially unsymmetric moieties which have PEG "tails" attached to polyester dendrimers of any desired number of generations. Further details about this particularly preferred approach are given in Example 1.

As noted above, methods of the invention call for inducing organization in the matrix material in the presence of the templating polymers. In many cases, suitable control of temperature is sufficient to induce organization which may occur through the interaction of the templating polymers with each other and with the surrounding matrix polymers. In other circumstances it may be that particular reagents, such as solvents or catalysts, are employed to achieve the desired organization. Particular molecular structures of the templating polymers will be more conducive to pure temperature control of templating polymer organization. The particular type of organization which occurs may depend on factors such as the percentage of templating polymer relative to matrix polymer. For example, as shown in Example 4 below, a lamellar organization is achieved for certain preferred templating polymers of the invention when 40 wt % or 70 wt % of templating polymer is used, whereas micellar organization is achieved when 20 wt % or less is used. The mechanism of organization in the example is templating. The templating polymers may, for example, form bilayers which extend in a planar fashion, inducing a lamellar structure.

Methods of the invention also call for curing of the matrix polymer. This can often be achieved simply by control of temperature. In other cases, reagents such as catalysts might be used to achieve the necessary degree of cross-linking of the matrix polymer for the applications of the nanocomposite.

It is to be understood that while the invention has been described in conjunction with the preferred specific embodiments thereof, that the foregoing description as well as the examples that follow are intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties. However, where a patent or application containing express definitions is incorporated by reference, those express definitions should be understood to apply to the incorporated patent or patent application in which they are found, and not to the remainder of the text of this application, in particular the claims of this application.

Unless otherwise indicated, all reagents were obtained commercially or synthesized according to known methods.

The following examples are detailed descriptions of the process of the invention. The detailed preparations fall within the scope of and serve to exemplify, the more generally described methods set forth above. The examples are presented for illustrative purposes only and are not intended to narrow the scope of the present invention in any way.

EXAMPLE 1

PREPARATION OF PEG-DENDRIMER COPOLYMERS

Acetonide protected bis-MPA was produced from bis-MPA using standard acetonide protection reactions from the literature. Acetonide-protected bis-MPA anhydride was prepared by self-condensation of the acetonide-protected bis-MPA using N,N'-dicyclohexylcarbodiimide (DCC). The acetonide-protected bis-MPA anhydride was reacted with PEG alcohols of molecular weights approximately 4,800 and 9,800 in the presence to DMAP (dimethylamino pyridine, 0.25 mol % with respect to anhydride) in $CH_2Cl_2$/pyridine solvent mixture (90/10). To insure quantitative conversion of the terminal hydroxyl groups, ~2-4 fold excess of anhydride was used and the reaction was performed at room temperature (~15-18 h) under nitrogen atmosphere. Upon completion, the excess anhydride was reacted with methanol to facilitate purification since the side products generated are soluble in ether and the PEG copolymers are not allowing polymer precipitation. Prior to precipitation, the solution was stirred (~3 h) with Amberlyst resin to remove acidic by-products. After precipitation, the product (acetonitride protected PEG bis-MPA ester) was isolated as a white powder (~80-85% yield). Deprotection of the acetonide groups was accomplished using DOWEX 50W-X2 ion exchange resin in methanol at 50° C. for 5 hours.

Figure 3:
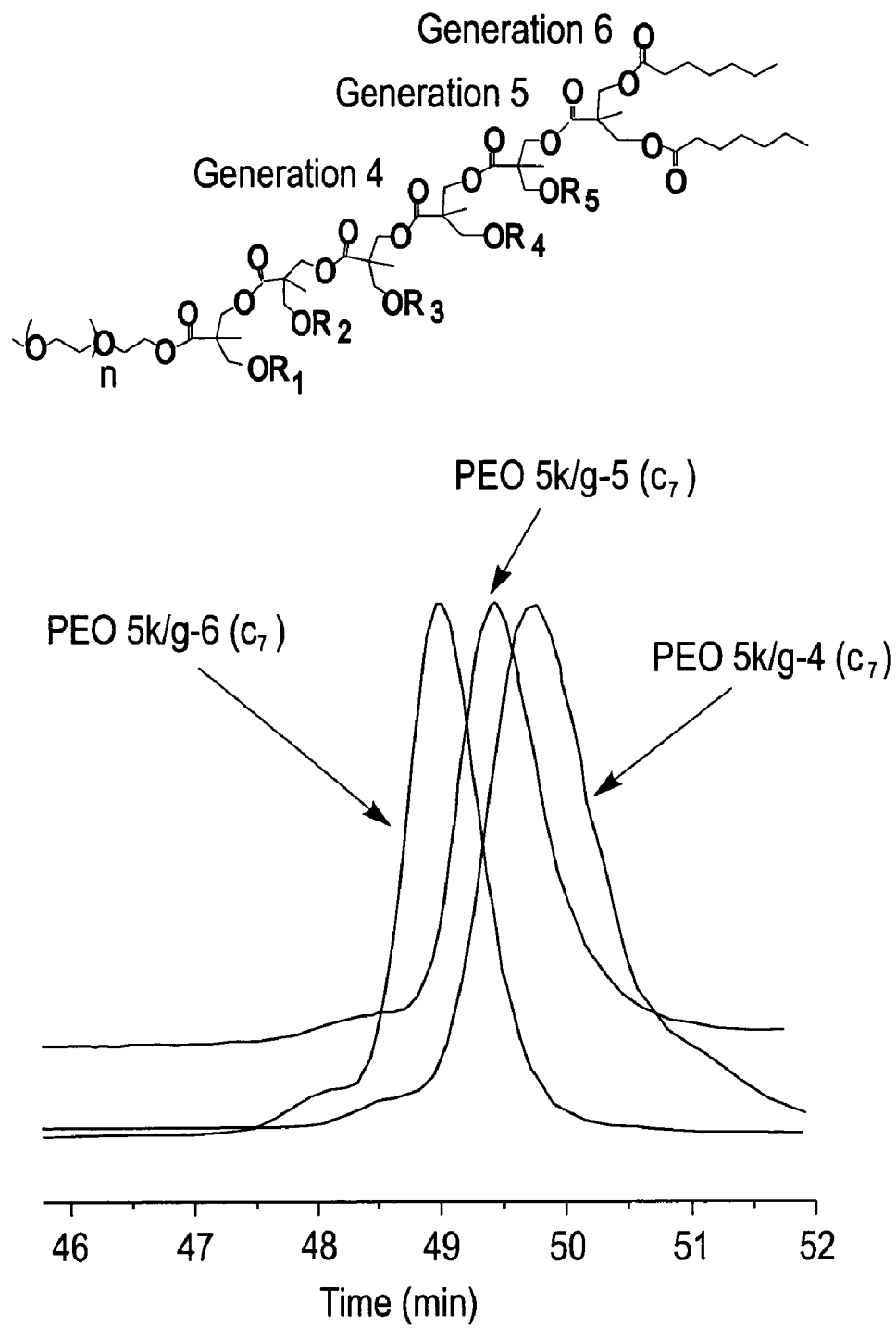
FIG. 3 depicts size exclusion chromatography (SEC) data for three preferred amphiphilic copolymer porogens of the invention.

The reactions indicated above were repeated to produce bis-MPA-based dendrons of successive generations up to 6. The surface hydroxyl groups of the dendrons for generations 4-6 were subsequently functionalized by esterification with heptanoic acid in $CH_2Cl_2$ using DCC/DPTS (4-(dimethylamino)pyridinium 4-toluenesulfonate)/DMAP. (The groups could also be functionalized using deuterated heptanoic acid or ferrocene carboxylic acid under similar conditions in order to enhance imaging by SANS (small angle neutron scattering), TEM or SAXS (small angle X-ray scattering).) $^{13}C$ NMR spectroscopy of the terminal quarternary carbons of the bis-MPA showed quantitative conversion to the esterified product. FIG. 3 depicts the SEC (size exclusion chromatography) results from analysis of generation 4, 5, and 6 PEG-dendrimer copolymers. The following table depicts certain characteristics of these copolymers. (In this table GPC stands for gel permeation chromatography and PDI for polydispersity index.)

| Sample Entry | $M_n$ (g/mol) PEG segment | Dendron Generation/ $M_n$ (g/mol) | Dendron Fraction (wt. %) | $M_n$ $^1$H NMR | $M_n$ GPC | PDI |
|---|---|---|---|---|---|---|
| 1-a | 4,800 | 4/4,030 | 45 | 9,000 | 9,700 | 1.08 |
| 1-b | 4,800 | 5/8,200 | 63 | 13,000 | 11,300 | 1.03 |
| 1-c | 4,800 | 6/12,000 | 71 | 16,800 | 14,000 | 1.04 |
| 2-a | 9,800 | 4/4,030 | 29 | 14,000 | 16,500 | 1.05 |
| 2-b | 9,800 | 5/8,200 | 45 | 18,000 | 18,200 | 1.05 |
| 2-c | 9,800 | 6/12,000 | 55 | 21,500 | 20,000 | 1.04 |

Note that a molecular weight of 4,800 for PEG corresponds to a degree of polymerization of about 110.

EXAMPLE 2

Figure 4:
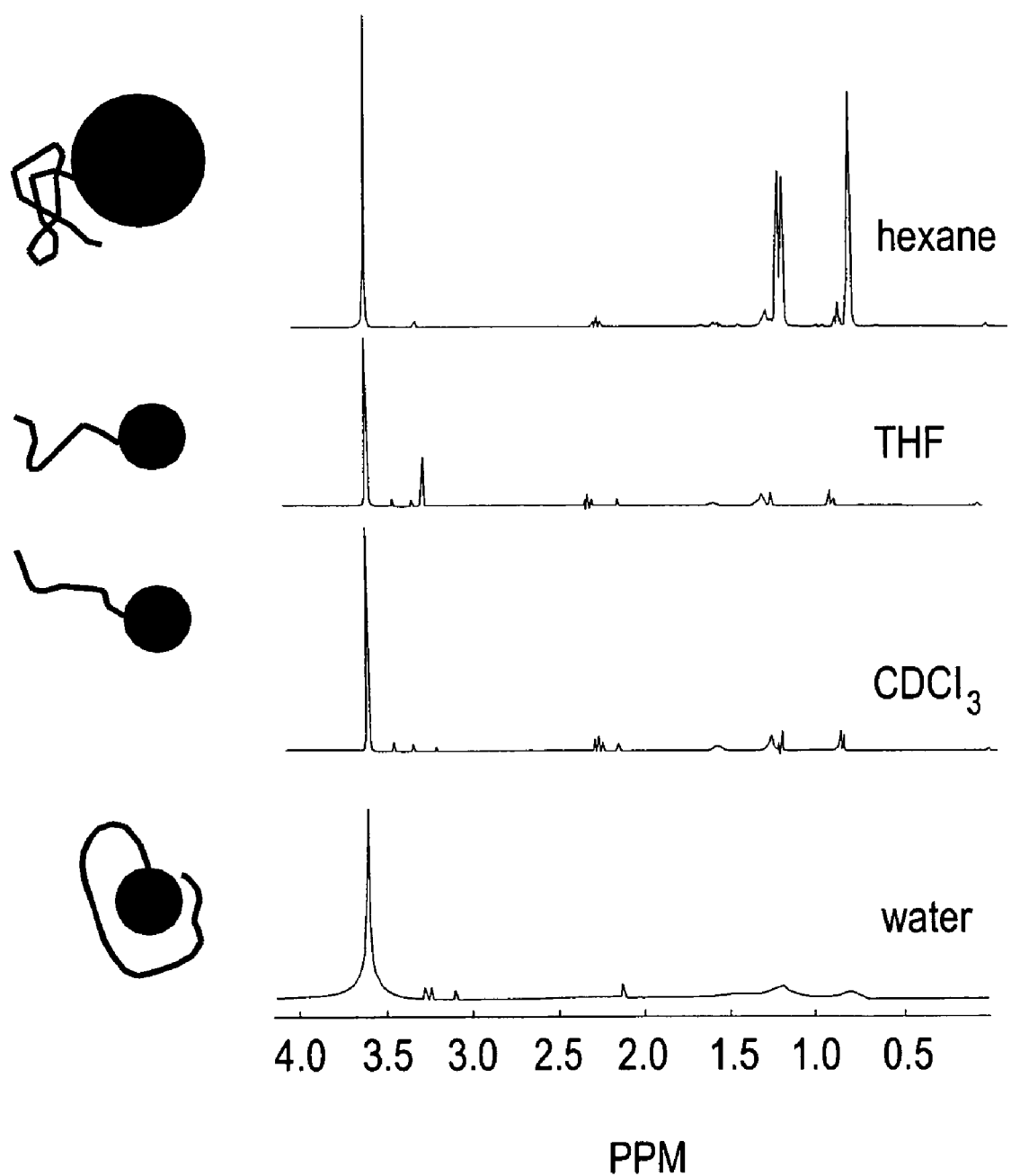
FIG. 4 presents $^1$H NMR spectra for an amphiphilic copolymer porogen of the invention in four different solvents, together with schematic drawings of the shape that such a copolymer is believed to assume in solution in the respective solvent.

EFFECT OF SOLVENT ON PEG-DENDRIMER COPOLYMERS $^1$H NMR spectra for the PEG-dendrimer copolymers of Example 1 were taken in hexane-d$_{14}$, deuterated water, THF-d$_8$, and CDCl$_3$. Hexane is a good solvent for the nonpolar dendritic component of these copolymers, deuterated water is a good solvent for the polar PEG component, and THF and CDCl$_3$ are good solvents for both components. The spectra are depicted in FIG. 4. As can be seen, in hexane the peaks associated with the heptanoic ester functionalized dendrimer are evident and sharp, whereas in water these peaks are broad and diffuse. In the remaining solvents, the signals for both components can be observed. These data support the view that the geometry of the preferred PEG-dendrimer copolymers changes with the environment.

EXAMPLE 3

FILMS TEMPLATED WITH PEG-DENDRIMER COPOLYMERS

The PEG-dendrimer copolymers were dissolved in a solution containing methyl silsesquioxane (MSSQ) prepolymer in propylene glycol monomethyl ether. The resulting solution was spun on a silicon wafer to produce thin films that were cured to 430° C. to effect cross-linking of the MSSQ and decomposition of the sacrificial templating copolymers.

Figure 5:
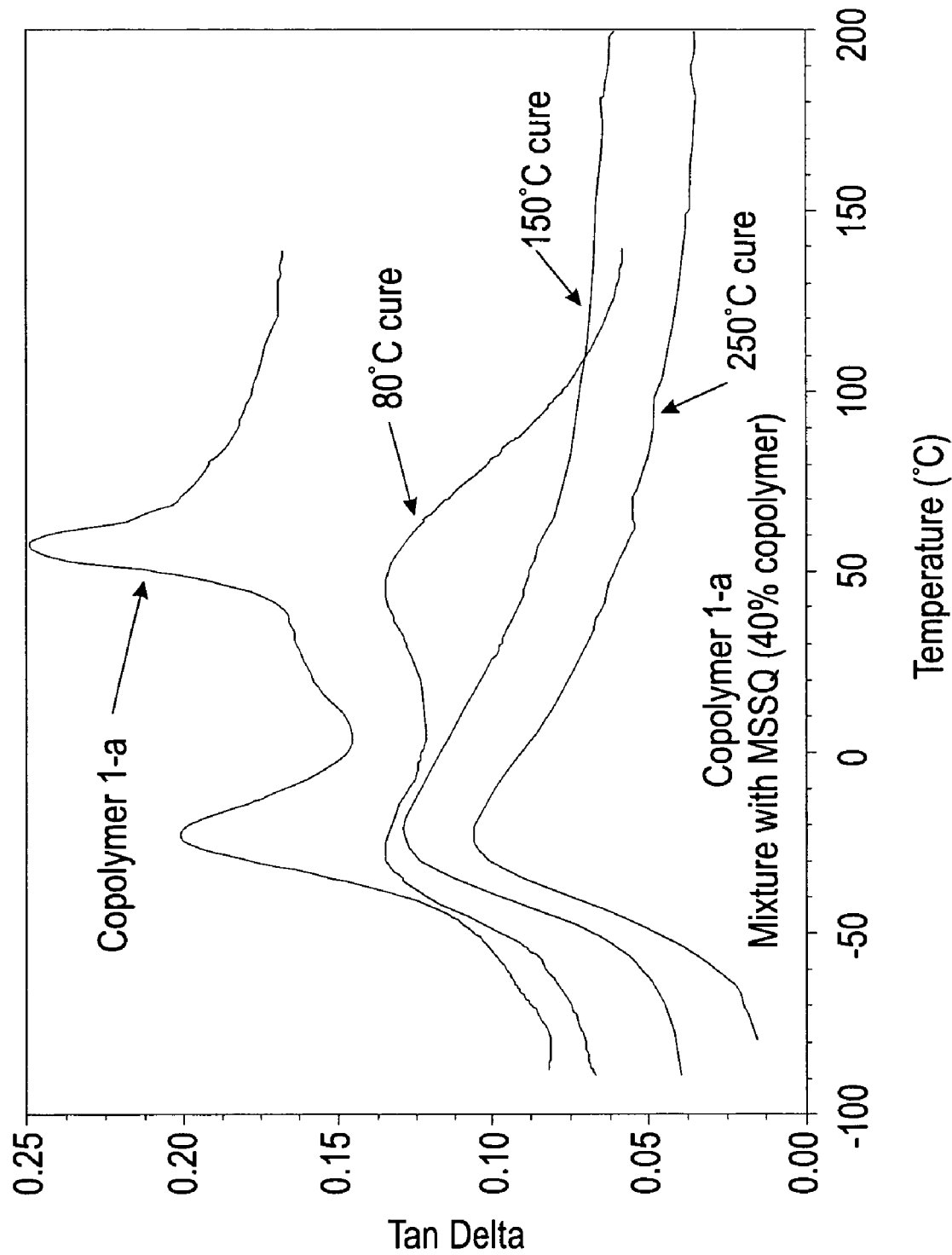
FIG. 5 presents dynamic mechanical analysis (DMA) tan δ data for a thin film of amphiphilic copolymer porogen 1-a of the invention and for three films containing such porogens partially cured to different temperatures.

FIG. 5 (top line) shows a Dynamic Mechanical Analysis (DMA) tan δ curve for a thin film of a PEG-fourth generation dendrimer copolymer of example 1. Note in particular that there are two T$_g$'s, which is indicative of microphase separated morphologies. It was found that the third through sixth generation copolymers also exhibit two T$_g$'s.

FIG. 5 (lines other than top line) shows representative tan δ curves obtained from Dynamic Mechanical Analysis (DMA) for a 1-a/MSSQ hybrid (40 wt. % copolymer loading) after cure temperatures of 80° (minimal advancement in MSSQ molecular weight), 150° (partial cure/advancement in molecular weight of MSSQ) and 250° C. (nearly complete cure or network formation of MSSQ). With the retention of the T$_g$ at −25° C. associated with the bis-MPA dendron phase, and the disappearance of the PEG transition, the data supports the existence of a two-phase structure formed prior to cure, irrespective of the cure temperature. The data precludes a nucleation and growth process, where the sacrificial polymer is initially miscible with the MSSQ and then phase separates with network formation. It is likely that the T$_g$ at 50° C. is the mixed T$_g$ of the PEG and MSSQ phases since they are miscible.

Figure 9:
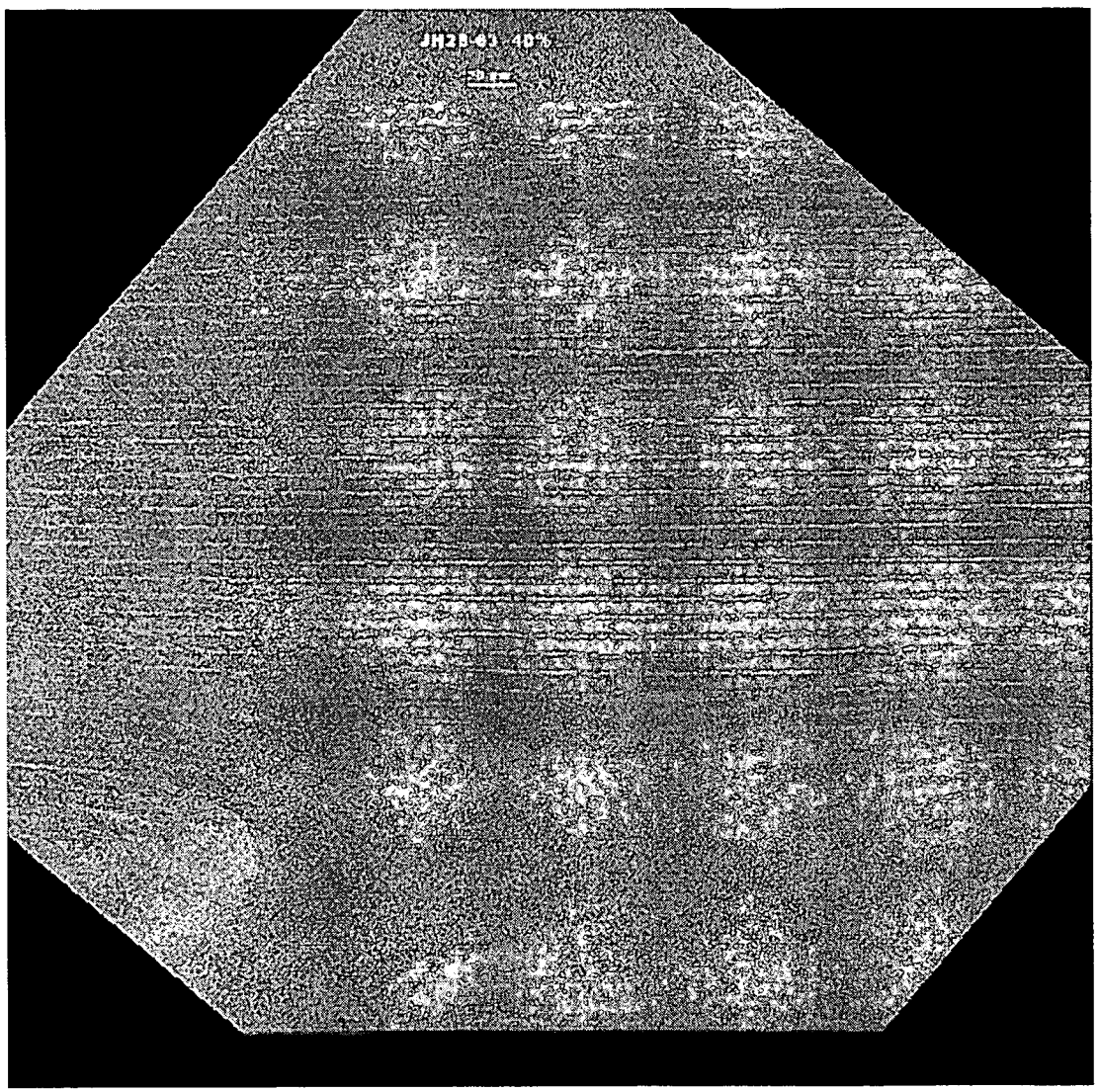
FIG. 9 shows a transmission electron micrograph for another lamellar structure of the invention.

FIG. 1 shows cross-sectional TEM micrographs of the composite resulting from mixtures of 40 wt. % and 60 wt. % of sample 1-a (a 4th generation dendron+PEG, 4,800 daltons) in MSSQ which has been calcined to 430° C. The lamellar structure is visible. Films created with 20 wt. % copolymer did not exhibit this lamellar structure. FIG. 9 shows a cross-sectional TEM micrograph of another lamellar structure formed with 40 wt. % porogen.

Figure 6:
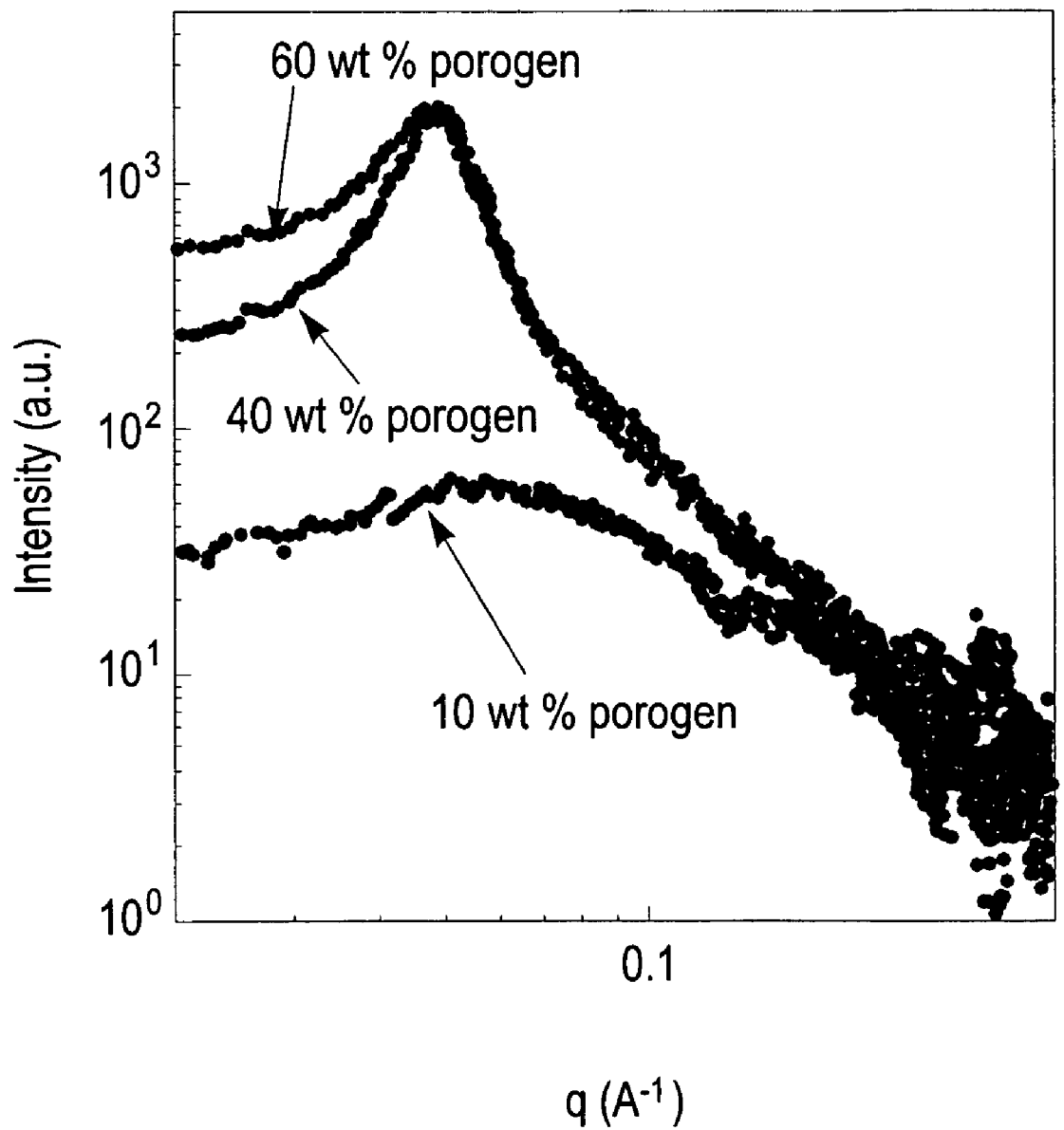
FIG. 6 presents SAXS data for mesoporous structures formed by methods of the invention.
Figure 7:
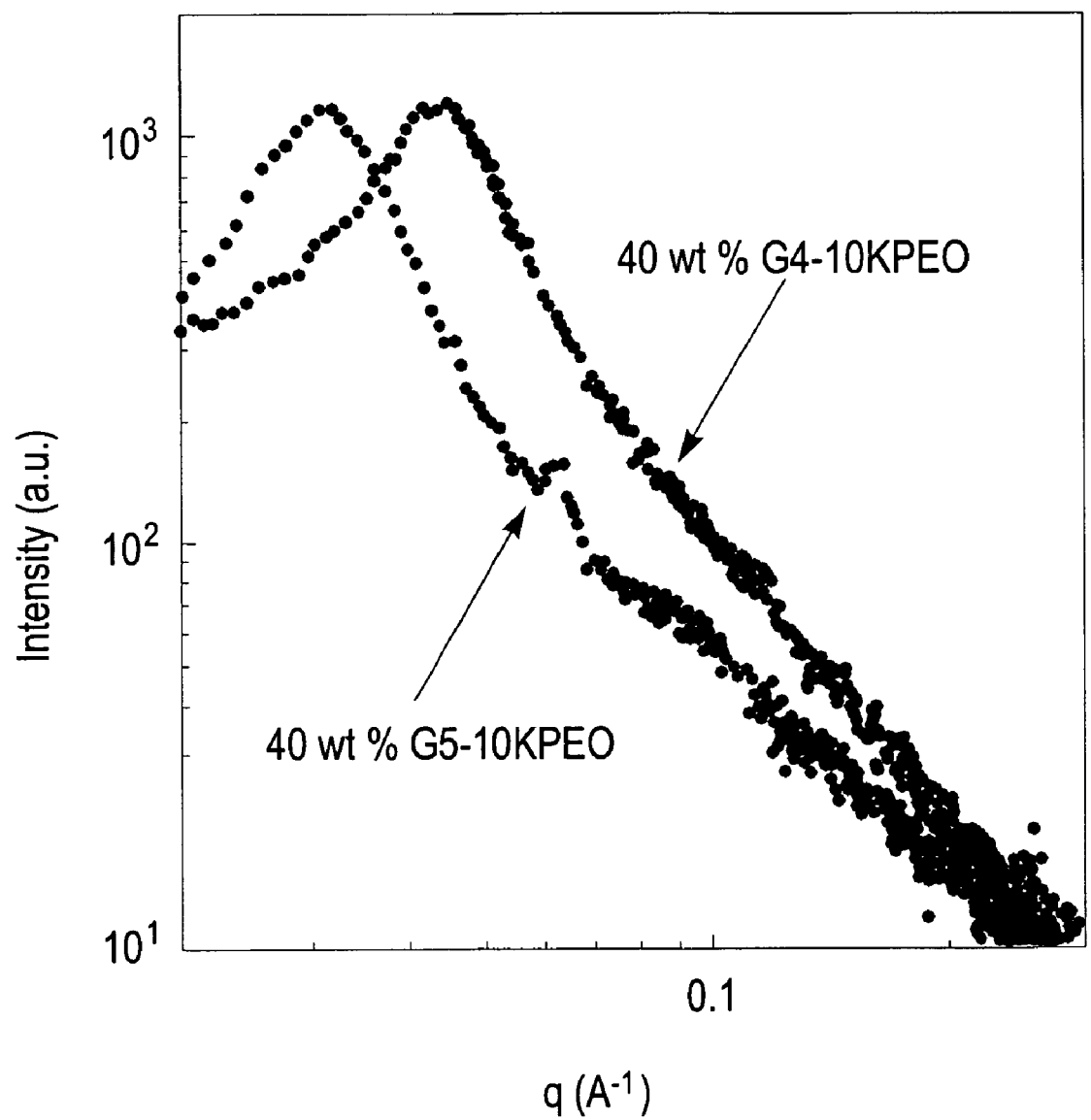
FIG. 7 presents SAXS data for mesoporous structures formed by methods of the invention.
Figure 8:
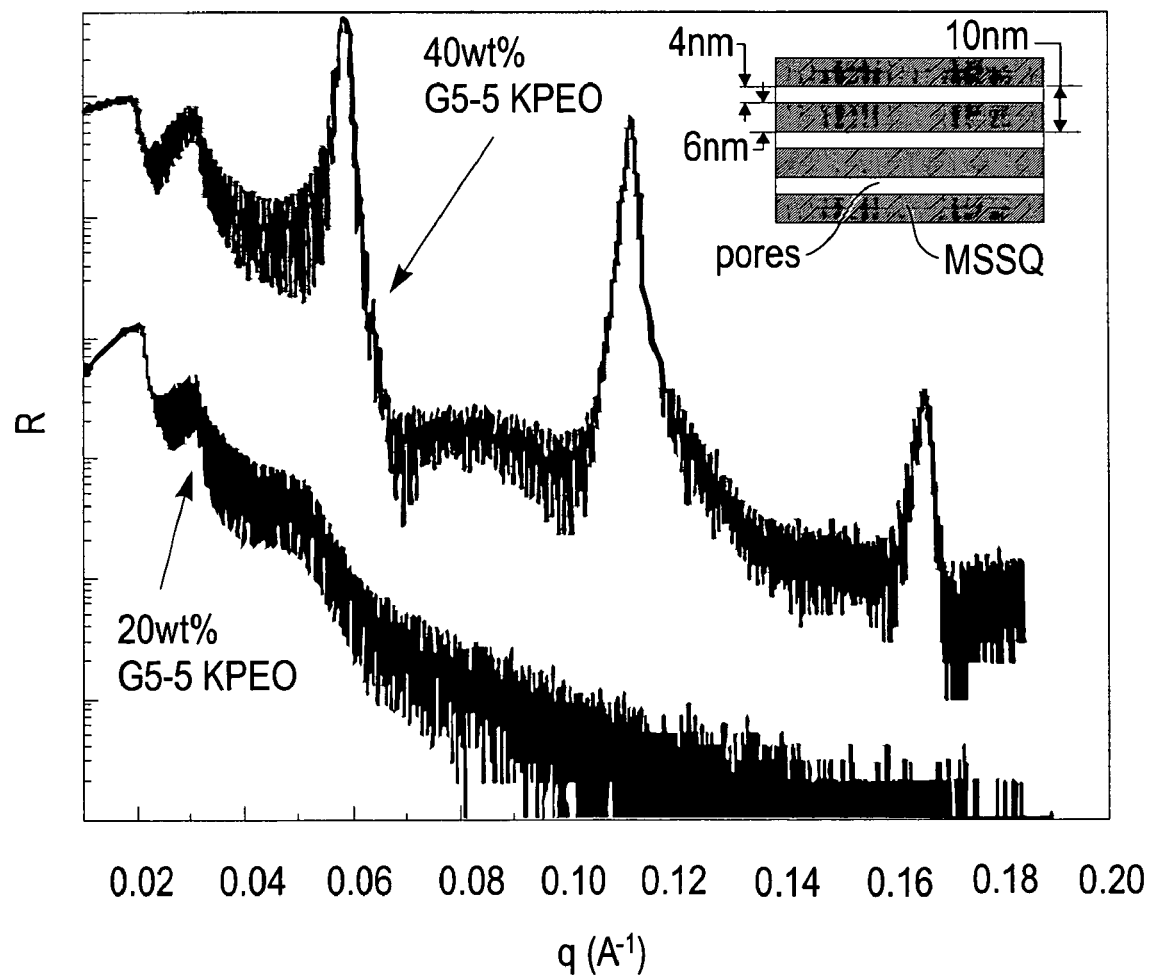
FIG. 8 presents XR data for mesoporous structures formed by methods of the invention.

Small angle x-ray scattering (SAXS) has been used to quantify nanoscopic structures. SAXS experiments were performed using the SB4-2 beam line at the Stanford Synchrotron Radiation Laboratory. FIGS. 6 and 7 show SAXS profiles of porous organosilicates. As shown in FIG. 6, scattering intensity increases with increasing amount of porogen. The porogen in FIG. 6 is G4-PEG5K (generation 5 dendrimer+PEG 4,800 daltons, sample 1-a). FIG. 7 shows data for porogens comprising two different generation dendrimers at 40 wt. % (generation 4 dendrimer+PEG 9,800 daltons and generation 5 dendrimer+PEG 9,800 daltons). Above 40 wt. % loadings, strong interpore correlation is shown as well with peaks corresponding to ~129 Å spacings. The interpore distance increases with higher generations of dendritic components in the copolymer as shown in FIG. 8. The peak position shifts to lower q region with increasing generation of dendritic component from generation 4 to 5 while molecular weight of PEG is fixed as 10 K.

X-ray reflectivity (XR) provides information in the film thickness direction, hence lamellar structures oriented parallel to the surface can be easily evaluated by strong scattering satisfying a Bragg condition. FIG. 8 shows XR profiles of 20 wt. % and 40 wt. % loadings of G5-PEG 5K (generation 5 dendrimer+PEG 4,800 daltons). For 40 wt. % loading, strong peaks satisfying Bragg's condition are observed, which indicates a layered structure of pores oriented parallel to the substrate. The first-order peak corresponds to periodic structure of 107 Å.

We claim:

1. A structure comprising:
three or more substantially parallel sheets of an organosilicate material separated by highly porous spacer regions, wherein the distance between the centers of adjacent sheets is in the range of about 1 to about 50 nm.

2. A structure according to claim 1, wherein the highly porous spacer regions are substantially free of condensed material.

3. A structure according to claim 1, wherein most of the volume of the highly porous spacer regions is occupied by air, other gases, or vacuum.

4. A structure according to claim 1, wherein said three or more substantially parallel sheets comprise at least four such substantially parallel sheets.

5. A structure according to claim 3 wherein the distance between the centers of any two adjacent sheets is substantially equal throughout the structure.

6. A structure according to claim 1, wherein the distance between the centers of any two adjacent sheets is in the range of about 1 nm to about 25 nm.

7. A structure according to claim 1, wherein the distance between the centers of any two adjacent sheets is in the range of about 1 nm to about 15 nm.

8. A structure according to claim 1, wherein the spacer regions between sheets account for about 25% to about 70% of the volume of the structure.

9. A structure according to claim 1, wherein the spacer regions between sheets account for about 35% to about 50% of the volume of the structure.

10. A structure according to claim 1, wherein the spacer regions between sheets account for more than about 30% of the volume of the structure.

11. A structure according to claim 1, wherein the structure has a dielectric constant less than about 3.0 at 25° C.

12. A structure according to claim 1, wherein the structure has a dielectric constant of from about 1.1 to about 3.0 at 25° C.

13. A structure according to claim 1, wherein the structure has a dielectric constant of from about 1.1 to about 2.5 at 25° C.

14. A structure according to claim 1, wherein the structure has a refractive index of from about 1.1 to about 1.5.

15. A structure according to claim 14, wherein the structure has a refractive index of from about 1.15 to about 1.24.

* * * * *